United States Patent
Ananthapur Bache et al.

(10) Patent No.: US 11,507,715 B2
(45) Date of Patent: Nov. 22, 2022

(54) DETECTION OF VEHICLE DEFECTS

(71) Applicant: International Business Machines Corporation, Armonk, NY (US)

(72) Inventors: Vijay Kumar Ananthapur Bache, Bangalore (IN); Padmanabha Venkatagiri Seshadri, Bangalore (IN); Vijay Ekambaram, Chennai (IN); Saravanan Sadacharam, Chennai (IN)

(73) Assignee: International Business Machines Corporation, Armonk, NY (US)

( * ) Notice: Subject to any disclaimer, the term of this patent is extended or adjusted under 35 U.S.C. 154(b) by 1002 days.

(21) Appl. No.: 16/207,792

(22) Filed: Dec. 3, 2018

(65) Prior Publication Data
US 2020/0175124 A1 Jun. 4, 2020

(51) Int. Cl.
 *G06F 30/18* (2020.01)
 *B62D 65/00* (2006.01)
 *G06F 30/15* (2020.01)

(52) U.S. Cl.
 CPC ........... *G06F 30/18* (2020.01); *B62D 65/005* (2013.01); *G06F 30/15* (2020.01)

(58) Field of Classification Search
 CPC .. G06F 16/2465; G06F 40/279; G06F 40/284; G06F 7/20; G06F 30/18; G06F 30/15; G06Q 10/20; G06Q 50/01; H04L 51/32; B62D 65/005
 See application file for complete search history.

(56) References Cited

U.S. PATENT DOCUMENTS

| | | | |
|---|---|---|---|
| 7,630,802 B2 | 12/2009 | Breed | |
| 8,019,501 B2 | 9/2011 | Breed | |
| 8,065,334 B2 | 11/2011 | Mukherjee et al. | |
| 9,317,983 B2 | 4/2016 | Ricci | |
| 2005/0038691 A1 | 2/2005 | Babu | |
| 2009/0254535 A1 | 10/2009 | Elckelmann et al. | |

(Continued)

FOREIGN PATENT DOCUMENTS

| CN | 103632211 | 3/2014 |
|---|---|---|
| WO | WO2014199177 | 12/2014 |

OTHER PUBLICATIONS

Liu et al., A Survey on Partial Retrieval of 3D Shapes, Journal of Computer Science and Technology 28(5): 836{851 Sep. 2013. DOI 10.1007/s11390-013-1382-9, 16 pages.

(Continued)

*Primary Examiner* — Kibrom K Gebresilassie
(74) *Attorney, Agent, or Firm* — Schmeiser, Olsen & Watts, LLP; Christopher Pignato

(57) ABSTRACT

A method, system and computer program product of detecting vehicle defects includes creating a first design graph, receiving information related to a defective design of a vehicle associated with the first design graph, tagging a defective part in the first design graph with defect information, comparing the first design graph with other design graphs using a graph-matching technique, determining that a second design graph matches the first design graph, the second design graph representing a potentially anomalous design, identifying a plurality of candidate vehicles that incorporate the potentially anomalous design, and recommending the candidate vehicles as service candidates.

20 Claims, 13 Drawing Sheets

(56) References Cited

U.S. PATENT DOCUMENTS

| | | | | |
|---|---|---|---|---|
| 2009/0300065 | A1* | 12/2009 | Birchall | G06Q 40/08 |
| | | | | 705/305 |
| 2014/0040434 | A1* | 2/2014 | Rybak | G07C 5/008 |
| | | | | 709/219 |
| 2014/0250489 | A1* | 9/2014 | Calo | H04L 63/20 |
| | | | | 726/1 |
| 2015/0081729 | A1 | 3/2015 | Rajpathak et al. | |
| 2015/0235480 | A1* | 8/2015 | Cudak | G05D 1/0297 |
| | | | | 701/2 |
| 2016/0035150 | A1* | 2/2016 | Barfield, Jr. | G05B 23/0254 |
| | | | | 701/29.3 |
| 2017/0091289 | A1* | 3/2017 | Ohazulike | H04L 51/32 |
| 2017/0337299 | A1* | 11/2017 | Tang | G06Q 50/08 |
| 2018/0129549 | A1* | 5/2018 | Fredericks | G06F 7/20 |
| 2020/0258057 | A1* | 8/2020 | Farahat | G06N 20/00 |
| 2020/0272137 | A1* | 8/2020 | Kilaru | G05B 19/41875 |

OTHER PUBLICATIONS

Eickelmann, Hans-Jurgen et al. "Search engine to improve product recall traceability activities." U.S. Appl. No. 12/061,240, filed Apr. 2, 2008.

IBM works on automotive warranty early-warning system, http://www.infoworld.com/article/2669599/operating-systems bm-works-on-automotive-warranty-early-warning-system.html, 2005, 3 pages.

Mell, Peter et al.; "The NIST Definition of Cloud Computing;" National Institute of Standards and Technology; Special Publication 800-145; Sep. 2011; 7 pages.

* cited by examiner

DETECTION OF VEHICLE DEFECTS

TECHNICAL FIELD

The present invention relates to detecting vehicle defects. More specifically, the invention relates to systems and methods for detecting vehicle defects prior to failure.

BACKGROUND

Automotive Original Equipment Manufacturers (OEMs) spend significant resources recalling vehicles that may have design issues or manufacturing defects. Recalls are based on the analysis done on the possible parts that might have design issues. Typically, an automotive OEM may recall all the vehicles of a particular model, trim level and year. Automotive OEMs do not have the ability to determine which specific vehicles could be a candidate for recall. OEMs make it a constant priority to prevent failure on the road as a result of product defects.

SUMMARY

An embodiment of the present invention relates to a method, and associated computer system and computer program product, of detecting vehicle defects. One or more processors of a computer system create a first design graph. Information is received related to a defective design of a vehicle associated with the first design graph. A defective part is tagged in the first design graph with detect information. The first design graph is compared with other design graphs using a graph-matching technique. The second design graph is determined to match the first design graph, the second design graph representing a potentially anomalous design. Vehicles are identified that incorporate the potentially anomalous design. The vehicles are recommended as service candidates.

DETAILED DESCRIPTION

Although certain embodiments are shown and described in detail, it should be understood that various changes and modifications may be made without departing from the scope of the appended claims. The scope of the present disclosure will in no way be limited to the number of constituting components, the materials thereof, the shapes thereof, the relative arrangement thereof, etc., and are disclosed simply as an example of embodiments of the present disclosure. A more complete understanding of the present embodiments and advantages thereof may be acquired by referring to the following description taken in conjunction with the accompanying drawings, in which like reference numbers indicate like features.

As a preface to the detailed description, it should be noted that, as used in this specification and the appended claims, the singular forms "a", "an" and "the" include plural referents, unless the context clearly dictates otherwise.

The present invention provides systems and methods for improving detection of vehicle anomalies and defects prior to failure. Some embodiments of the present invention may recognize that any system which could better identify vehicular candidates for recall prior to failure would be extremely valuable to OEMs and their customers. The present invention improves and optimizes product lifecyle management (PLM) systems by providing a mechanism to flag potential defects or anomalies that are unobserved or unchecked based on already observed or known defects or anomalies. The present invention may be practiced without human interaction, through automated processes for receiving vehicle information and automatically analyzing and providing recommendations or initiating recalls. Thus, the present invention, when practiced, seeks to improve the quality of all driven vehicles, for all consumers. The present invention seeks to make transportation safer. While the present invention is exemplified using road vehicles, it will be apparent that the concepts described herein may be applicable to other consumer products and/or vehicles, such as aircraft, boats, mass transportation vehicles (trains, buses, etc), or non-transportation consumer products, such as construction vehicles, computer hardware, or the like.

Figure 1:
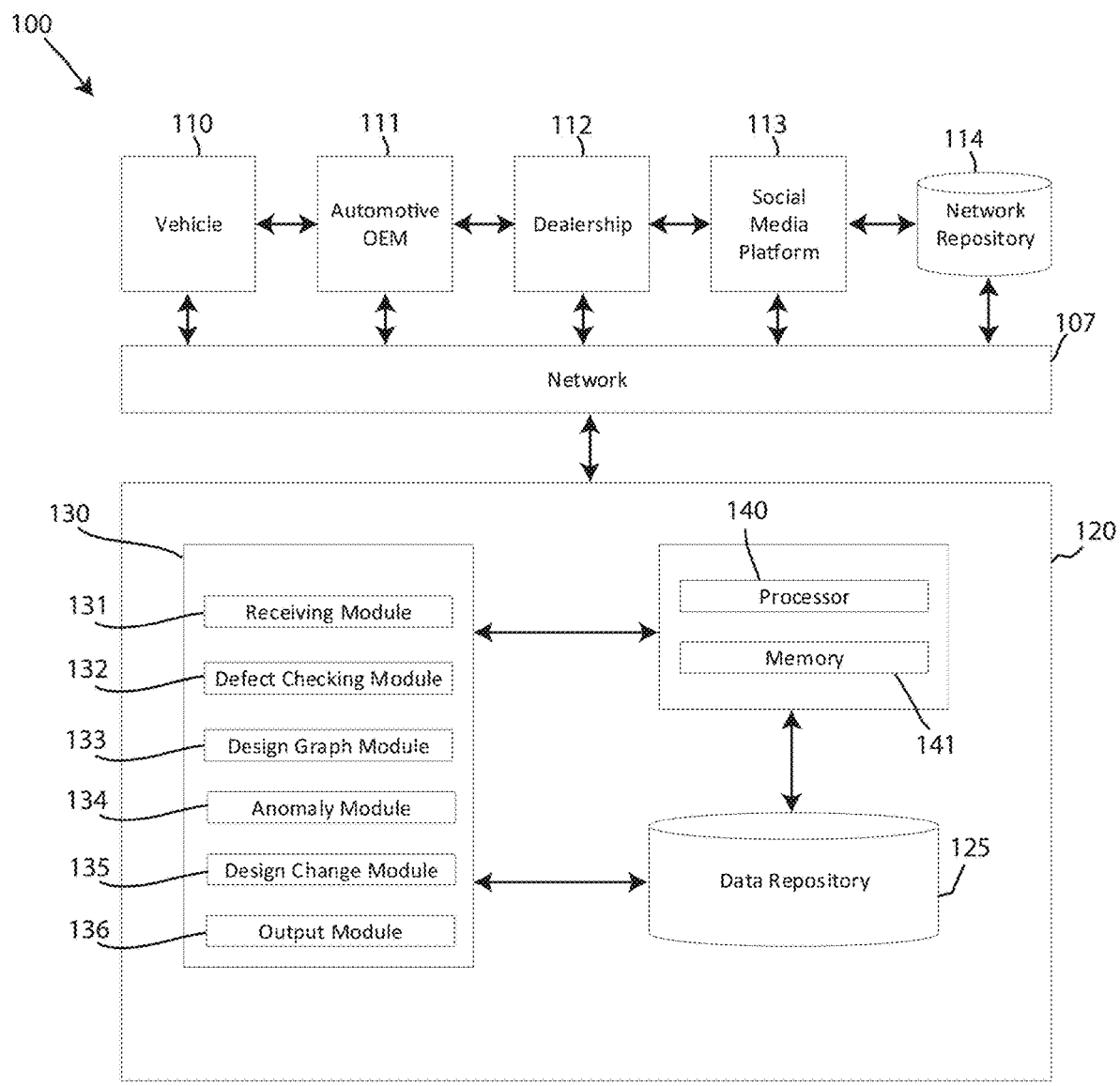
FIG. 1 depicts a block diagram of a system of detecting vehicle defects, in accordance with embodiments of the present invention.

Referring to the drawings, FIG. 1 depicts a block diagram of a system for detecting defects in a vehicle 100, in accordance with embodiments of the present invention. Embodiments of the system for detecting defects in a vehicle 100 include the ability to evaluate a vehicle for defects by leveraging multiple sources of information such as social media, dealer service, and the like and catalogue reliable design features during service in a PLM data store. Embodiments of the system for detecting defects in a vehicle 100 are configured to create a design graph annotated with a part source, coupling strength. Embodiments of the system for detecting defects in a vehicle 100 are further configured for localizing a defect of a defective design within the design graph. Still further, embodiments of the system for detecting defects in a vehicle 100 are configured to compare design graphs in the PLM catalogue to determine potential matching designs to the defective design graph, and flag potential anomalies. The system for detecting defects in a vehicle 100 may still further be configured to match a flagged design graph with design graphs associated with reliable designs and recommend a service center, for example, to address potential issues, and further recommend recall candidates. Thus, it should be understood that the invention and the system 100 is not limited to only detecting vehicle defects, and may be configured to provide any of the various functionality described herein.

The system for detecting defects in a vehicle 100 may include a vehicle 110, an automotive OEM 111, a dealership 112, a social media platform 113 and a network repository 114 connected over a network 107 to a computer system 120. Each of the vehicle 110, the automotive OEM 111, the dealership 112, the social media platform 113 and the network repository 114 may each represent a plurality or a single one of the given element 110, 111, 112, 113, 114. Some or all of the vehicle 110, the automotive OEM 111, the dealership 112, the social media platform 113 and the network repository 114 may be interconnected to others of these devices. While FIG. 1 shows the vehicle 110, the automotive OEM 111, the dealership 112, the social media platform 113 and the network repository 114 directly connected to adjacent elements 110, 111, 112, 113, 114, any interconnection (e.g. non-adjacent) of elements 110, 111, 112, 113, 114 is contemplated. Further, while each of the elements 110, 111, 112, 113, 114 are shown as separate features of the system for detecting vehicle defects 100, in some embodiments one or more of the elements 110, 111, 112, 113, 114, may be combined or contain overlapping structure and functionality (e.g, the automotive OEM 111 may include functionality or features attributed in the present description to the social media platform 112).

In one exemplary embodiment of the invention, a buyer buys the vehicle 110 from the dealership 112. Before a free service the buyer finds a brake problem with the vehicle 110. The buyer reports the problem with the dealership 112 and the dealership 112 fixes the brake problem during a service appointment. During the next several months, the buyer finds the same brake problem with the vehicle 110. The dealership 112 may be providing information to the automotive OEM 111 about the repeated problem with the specific vehicle 110 and/or model that the vehicle 110 is classified into. The automotive OEM 111 may track similar instances from the information provided by other dealerships regarding the model of the vehicle 110. The computer system 120 may be configured to analyze the historical data of product design and prototyping information, for example, to identify the most successful design of a similar type—one in which no design issues have arisen.

In the embodiment shown, the vehicle 110 may be one or more automobiles of any type, and may include a communication system and may be configured to provide diagnostic data to the computer system 120. For example, embodiments of the vehicle 110 include cars, trucks, buses, or the like. In other embodiments, the vehicle 110 may be replaced by an airplane, helicopter, train, or any mechanism that provides for transportation. The vehicle may also be a commercial equipment vehicle that is designed for commercial use. In still other embodiments of the invention, the vehicle 110 may be any consumer product that may be used or operated by a human and which safety of use and product liability is a concern.

The automotive OEM 111 represents the original manufacturer of the vehicle 110. The automotive OEM 111 may include one or more databases that contain stored information related to the vehicle 110, such as product lifecyle management (PLM) information or data stores. The automotive OEM 111 may be configured to provide this PLM information or data to the computer system 120. The automotive OEM 111 may store and retain information other than PLM information. The automotive OEM 111 may be configured to provide whatever information it retains about the vehicle 110 to the computer system 120. In other embodiments of the invention, the automotive OEM 111 may be replaced by any OEM or original product manufacturer.

The dealership 112 represents any automotive dealer and/or service provider of the vehicle 110. The dealership 112 may include one or more automotive dealerships which sell vehicles such as the vehicle 110. The dealership 112 may retain information related to services, accidents, or the like, of the vehicles sold by the dealership 112 and provide this information to the computer system 120. For example, the dealership 112 may be configured to provide service history and warranty data, and general customer data, to the computer system 120. The dealership 112 may obtain geographic information, customer information, vehicle information, or the like, and provide this information to the computer system 120.

The social media platform 113 represents one or more social media platforms that might contain information related to vehicles including the vehicle 110. The social media platform 113 may be configured to automatically locate and provide information related to vehicle problems to the computer system 120. In one embodiment, the computer 120 may be configured to be in communication with the social media platform 113 to scrape such information from the social media platform 113. Whatever the embodiment, the computer system 120 may be configured to receive information generated from the social media platform 113 related to the condition, problems, geographic location, or the like, of a vehicle such as the vehicle 110. This information may be in the form of user communications, posts, conversations, user-input information, or the like.

The network repository 114 is a data collection area on the network 107 which may back up and save all the data transmitted back and forth between the nodes of the network 107. For example, the network repository 114 may be a data center saving and cataloging data sent between the nodes of the network 107. The network repository 114 uses this data to generate databases related to the information received. In some embodiments, a data collection center housing the network repository 114 may include an analytic module capable of analyzing each piece of data being stored by the network repository 114. Further, the computer system 120 may be integrated with or may be a component of the data collection center housing the network repository 114. In some alternative embodiments, the network repository 114 may be a local repository that is connected to the computer system 120.

The network 107 is any group of two or more computer systems linked together. The network 107 may represent, for example, the internet. The network 107 may be any type of computer network known by individuals skilled in the art. Examples of computer networks which may be embodied by the network 107 may include a LAN, WAN, campus area networks (CAN), home area networks (HAN), metropolitan area networks (MAN), an enterprise network, cloud computing network (either physical or virtual) e.g. the Internet, a cellular communication network such as GSM or CDMA network or a mobile communications data network. The architecture of the network 107 may be a peer-to-peer network in some embodiments, wherein in other embodiments, the network 107 may be organized as a client/server architecture. The computer system 120 is shown connected to the automotive OEM 111, the dealership 112, the social media platform 113 and the network repository 114 via the network 107.

The computer system 120 is shown as a separate computer system from the automotive OEM 111 in the embodiment shown. However, in other embodiments, the computer system 120 may be owned, operated and/or controlled by the automotive OEM 111, or product manufacturer (in the case the product is not an automobile or vehicle). Thus, the computer system 120 may be a system used and implemented by the automotive OEM 111 itself, or through a third party service to which the automotive OEM 111 subscribes.

Embodiments of the computer system 120 is shown including a module structure 130 that includes a receiving module 131, a defect checking module 132, a design graph module 133, an anomaly module 134, a design change module 135, and an output module 136. A "module" herein refers to any hardware-based module, software-based module, or combination thereof. Embodiments of hardware based modules may include self-contained components such as chipsets, specialized circuitry and one or more memory devices, while a software-based module may be part of a program code or linked to the program code containing specific programmed instructions, which may be loaded in the memory device of the computer system 120. A module (whether hardware, software, or a combination thereof) may be designed to implement or execute one or more particular functions or routines.

Embodiments of the receiving module 131 include one or more components of hardware and/or software program code for obtaining, retrieving, collecting, or otherwise receiving information from the vehicle 110, the automotive OEM 111, the dealership 112, the social media platform 113 and/or the network repository 114. In an exemplary embodiment, the receiving module 131 is configured to receive vehicle diagnostic information from the vehicle. The receiving module 131 is further configured to receive information from the automotive OEM 111 such as PLM data related to product design, product prototyping and testing, PLM data related to historical data about the part or part design, or parts traceability information. The receiving module 131 is configured to receive dealer warranty data, dealer service history and vehicle service history, along with parts traceability from, for example, the dealership 112. The receiving module 131 is further configured to receive information from the social media platforms 113 related to vehicles such as the vehicle 111. The receiving module 131 provides information received by the computer system 120 from the vehicle 110, the automotive OEM 111, the dealership 112, the social media platform 113 and the network repository 114 to be stored in the data repository 125.

Referring still to FIG. 1, embodiments of the computer system 120 shown further includes a defect checking module 132. Embodiments of the defect checking module 132 include one or more components of hardware and/or software program code configured for checking for reported defects based on the received information by the receiving module 131. The defect checking module 132 may be configured to determine when defects are physically verified by service centers. The defect checking module 132 may be configured to catalogue defects. In one embodiment, the defect checking module 132 is configured to receive information related to a defective design of a vehicle from one or more dealerships. For example, if many different dealerships are reporting the same faulty part on the same model vehicle, this information may be used by the defect checking module 132 to determine a defective design. The defect checking module 132 may further be configured, from the information received, to determine that reported issues arise from customer events such as accidents. Alternatively, the defect checking module 132 may be configured to determine whether a reported issue may be, or is, related to a design level defect. The defect checking module 132 may be configured to catalogue and verify reported issues or defects. Cataloguing information may include cataloguing information related to both reported detects, or reported reliable designs. For example, if many dealerships are providing information to the computer system 120 related to the reliability or proper function of a part, the defect checking module 132 may be configured to note and store this information in a manner such that the information is associated with a particular design or design graph, as described herein below. In this manner, the defect checking module 132 may be configured to provide a confidence rank related to specific designs within a database that includes PLM information. The more positive feedback or information received related to a given part or design, the higher the confidence ranking.

Referring still to FIG. 1, embodiments of the computer system 120 shown further includes a design graph module 133. Embodiments of the design graph module 133 include one or more components of hardware and/or software program code configured for fetching a design artifact from a PLM data store along the part traceability pedigree to create a design graph. To create a design graph, the design graph module 133 may be configured to decompose a design artifact into parts using part-segmentation and part-graph creation techniques. A design artifact may represent a distinct entity in a product, such as a component, part, subassembly or assembly. Design artifacts may include design features, analysis features, manufacturing features, or the like. The design graph module 133 may be configured to create design graphs having a hierarchical design, including maintaining information related to the level of the part or sub-part in the design. The design graph module 133 may be configured to label the space or edges between the parts in the design graph based on the coupling strength between parts, which may be measured based on multiple criteria such as shared surface area, the number of shared fixtures or the like. Various other relationships between parts may further be noted in the space between the parts. The design graph module 133 may be configured to note relationships between parts through arrows. The design graph module 133 may be configured to label parts with part traceability pedigree information which may identify part origin.

Referring still to FIG. 1, embodiments of the computer system 120 shown further includes an anomaly module 134. Embodiments of the anomaly module 134 include one or more components of hardware and/or software program code configured for taking a reported defect determined by the defect checking module 132, applying the reported defect to any design graphs created by the design graph module 133 that are associated with the defect checking module 132, and further finding additional potential design graphs which may be similar enough to the defective design that might be potentially anomalous or defective.

To accomplish this functionality, the anomaly module 134 may be configured for applying graph-matching techniques to determine when two design graphs created by the design graph module 133 are the same or similar. Once a pair of designs is determined by the anomaly module 134 to be a match, the anomaly module 134 may be configured to determine the nearest neighbor match to an identified defective part. The anomaly module 134 is configured to note when the nearest neighbor part s potentially anomalous. The anomaly module 134 may further be configured to flag anomalies in potentially similar design graphs by reviewing the coupling strength of the anomalous part with its connected neighboring parts on a design graph. The anomaly module 134 may be configured to repeat this process until no more connected nodes are found from a determined anomalous part node.

Referring still to FIG. 1, embodiments of the computer system 120 shown further includes a design change module 135. Embodiments of the design change module 135 include one or more components of hardware and/or software program code configured to find potential candidate design graphs representing designs with a higher degree of confidence or reliability, as determined by the defect checking module 132, than a design graph that is determined to be analogous or defective. The design change module 135 may be configured to suggest corresponding parts from a more reliable design graph for a part correction on a defective design graph, or any potentially defective design graphs that are found by the anomaly module 134. The design change module 135 may be configured to provide any potentially anomalous design graphs, and suggested associated reliable designs, to the output module 136.

Referring still to FIG. 1, embodiments of the computer system 120 shown further includes an output module 136. Embodiments of the output module 136 include one or more components of hardware and/or software program code configured for determining which vehicles or products are associated with potentially defective designs. Embodiments of the output module 136 include one or more components of hardware and/or software program code also configured for suggesting or implementing design changes to vehicles determined to be associated with effective design graphs. For example, the output module 136 may be configured to identify vehicles that implement designs found in defective design graph, or design graphs similar enough to a defective design graph to be flagged by the anomaly module 134. The output module 136 may be configured to send out a recall recommendation or request on the found vehicles, and provide a suggestion as to how to replace or service the defective part to make the vehicle have parts that correspond to the more reliable design graph as determined by the design change module 135.

Referring still to FIG. 1, embodiments of the computer system 120 may be equipped with a memory device 142 which may store information being used by the module structure 130 of the computer system 120. The computer system 120 may further be equipped with a processor 141 for implementing the tasks associated with the system for detecting vehicle defects 100 and perform processing associated with the functionality of the module structure 130.

Figure 2:
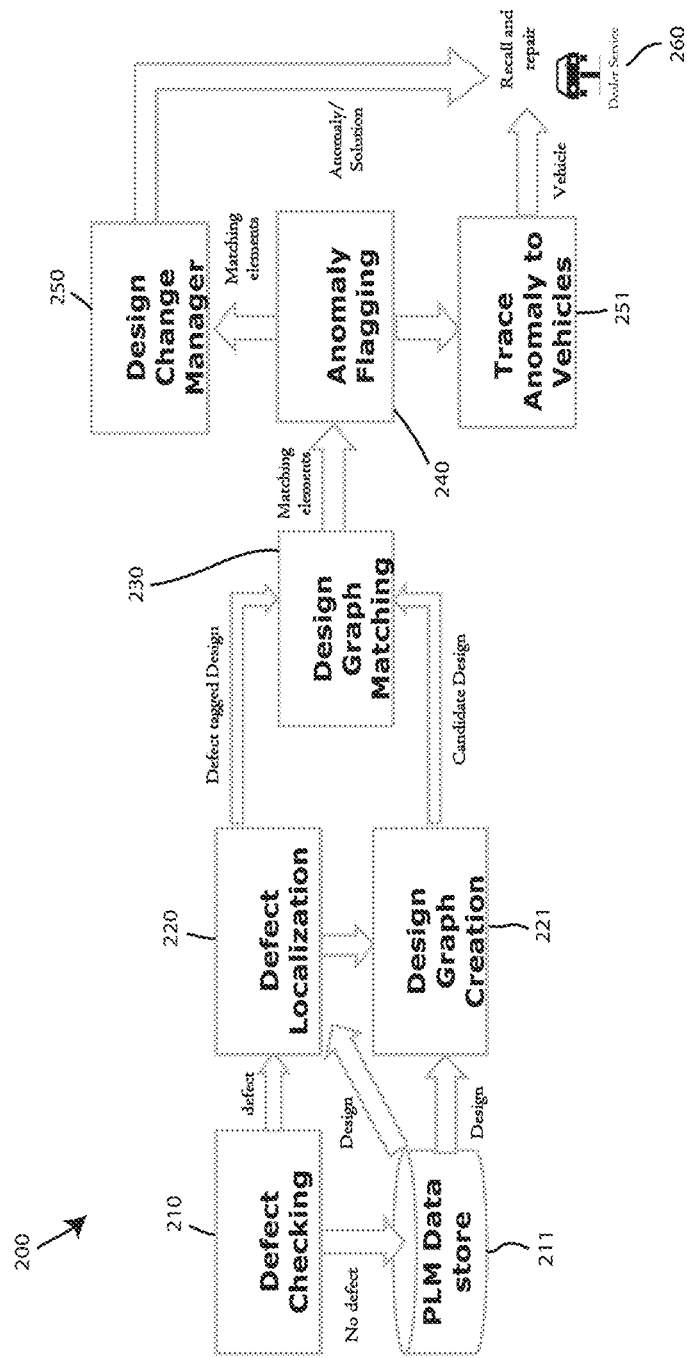
FIG. 2 depicts a flow chart of a method for detecting vehicle defects, in accordance with embodiments of the present invention.

FIG. 2 depicts a flow chart of a method 200 for detecting vehicle defects, in accordance with embodiments of the present invention. The method includes a step 210 of defect checking 210. At this step 210, defects in vehicles may be reported through multiple modalities such as social media complaints, telematics and diagnostic data, or from dealer service centers. Reported defects may be physically verified by service centers and catalogued by the computer system 120 once received. If there are no detects in the design level, but the issues arise from customer events such as accidents, this may be accounted for by the computer system 120 receiving the information, in order to not reduce the confidence in a design. If there is no defect, information is provided to a PLM data store 211.

If a detect is detected, a step 220 of detect localization occurs. Detect localization may include tagging a design graph created during step 221. A step 221 of design graph creation step occurs based on information from the PLM data store 211. The step 221 of creating a design graph may occur before any defects are detected, or information is received related to the defectiveness or reliability of a design. The design graph creation step 221 may include fetching a design artifact from a PLM data store, along with part traceability pedigree. The design graph creation step 221 may include decomposing the design artifact into parts using part-segmentation and part-graph creation techniques. The edges between parts in the part graph may be labeled based on the coupling strength which maybe measured based on multiple criteria such as shared surface area, number of shared fixtures, rivets, gears or other attachment mechanisms, or the like. The parts in the design graph may be labeled with parts traceability pedigree which may identify the origin of the parts. Design graphs created by the design graph creation step 221 may be updated when defects are found and localized in steps 210, 220. Design graphs created by the design graph creation step 221 may be updated when reliable designs are found as well, A step 230 includes design graph matching between a defect tagged design, and a candidate design. The step 230 may include using graph-matching techniques. Once a pair of designs are determined to be a match, the step 230 may include identifying a nearest neighbor match to the defective part(s) in a design graph, and marking any of those neighbors as potentially anomalous or potentially defective. For example, if both a truck and a car use a shattering glass windshield, shattering issues reported in the truck may be used to mark a potentially problematic windshield design in the car.

When matched elements are found, a step 240 includes anomaly flagging. Anomaly flagging may include determining the coupling strength of the anomalous part with its connected parts on the design graph. Determining these coupling strengths may be repeated until no more connected nodes can be reached from the anomalous or potentially anomalous node. From the step 240 of anomaly flagging, a step 250 includes interfacing with a design change manager, such as the design change module 135, with respect to other potentially matching elements. The step 250 may include matching a potentially anomalous or defective design with a similar design found to have a higher degree of reliability or confidence level rating. The step 250 may include suggesting corresponding parts from the reliable design for the potentially anomalous or defective design, for a part correction.

Additionally, from the step 240 of anomaly flagging, a step 260 includes tracing the anomaly to vehicles. Once anomalies are detected and a solution is found, the vehicles adopting the anomalous or defective design may be identified using PLM data. A final step 260 includes recommending for recall and/or recalling vehicles for repair at a dealer service, such as recalling the vehicle 110 to the dealership 112.

Figure 3:
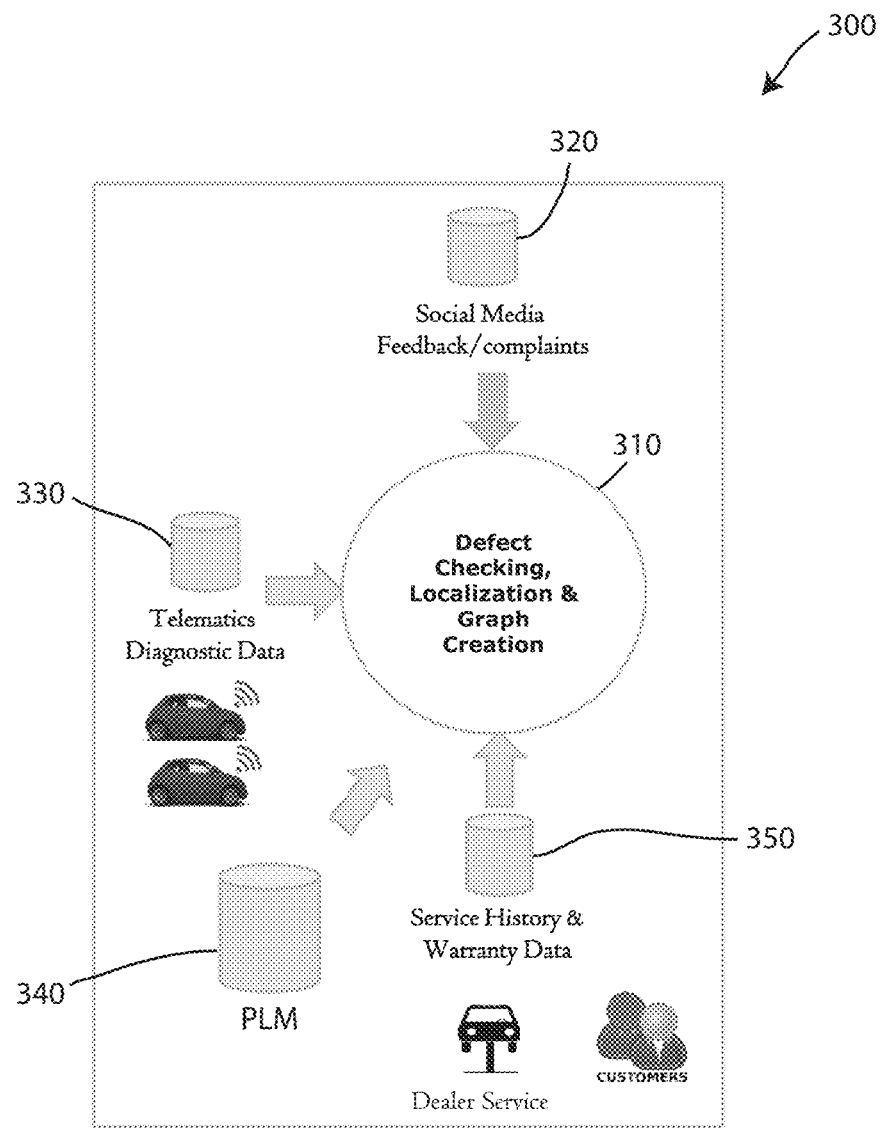
FIG. 3 depicts a process flow depicting information being received in the method for detecting vehicle defects of FIG. 2, in accordance with embodiments of the present invention.

FIG. 3 depicts a process flow 300 depicting information being received in the method for detecting vehicle defects of FIG. 2, in accordance with embodiments of the present invention. In particular, the process flow 300 includes receiving social media feedback or complaints 320 into a defect checking, localization and graph creation module 310, such as the module structure 130. The process flow 300 further includes receiving telematics or diagnostic data 330 from vehicles, such as the vehicle 110. The process flow 300 further includes receiving information from a PLM 340, such as from the automotive OEM 111. The process flow 300 further includes receiving service history or warranty data 350 from, for example, a dealer service or directly from customers.

Figure 4:
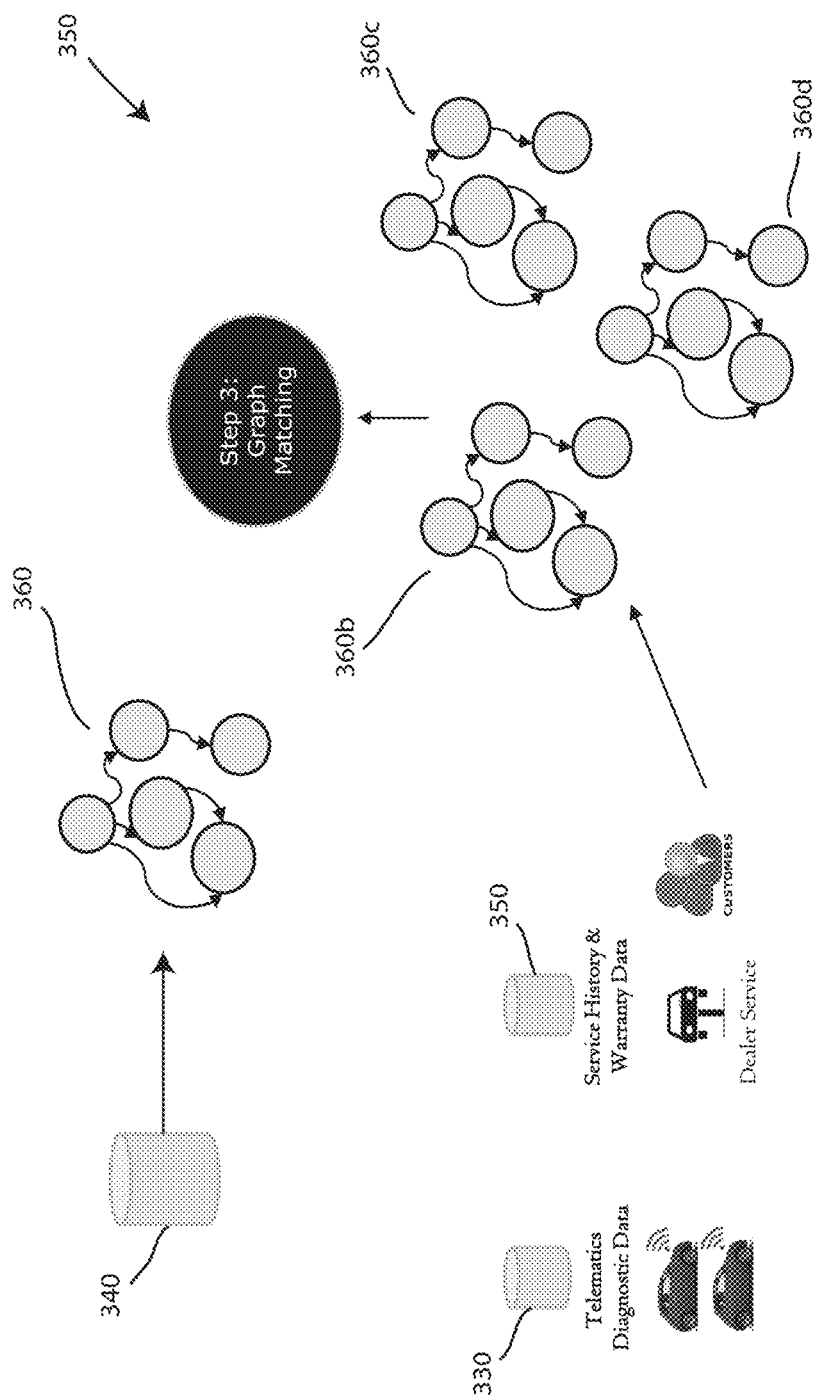
FIG. 4 depicts a process flow of graph creation and matching steps of the method for detecting vehicle defects of FIG. 2, in accordance with embodiments of the present invention.

FIG. 4 depicts a process flow 350 of graph creation and matching steps of the method for detecting vehicle defects of FIG. 2, in accordance with embodiments of the present invention. The process flow 350 includes using information from the PLM 340 to create a first design graph 360a. The process flow 360 includes receiving the telematics or diagnostic data 330 and service history or warranty data 350 and using this information to create design graphs 360b, 360c, 360d. The design graphs 360a, 360b, 360c, 360d may be created across various geo or performance conditions for the same model of the vehicle. The process flow then includes using all of these created design graphs 360a, 360b, 360c, 360d in a matching process. While the matching process may determine that the design graphs 360a, 360b, 360c, 360d match, the matching process may include reviewing various other design graphs (not shown) to determine that those design graphs do not match.

Figure 5:
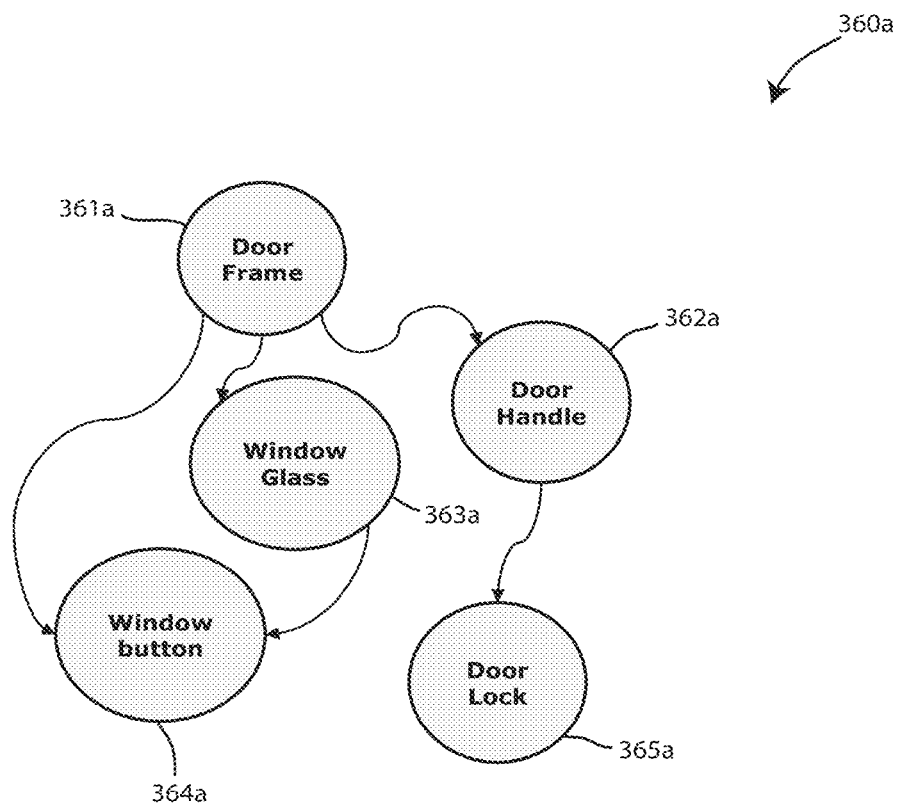
FIG. 5 depicts a first design graph created by the system of FIG. 1 using the method of FIG. 2, in accordance with embodiments of the present invention.
Figure 6:
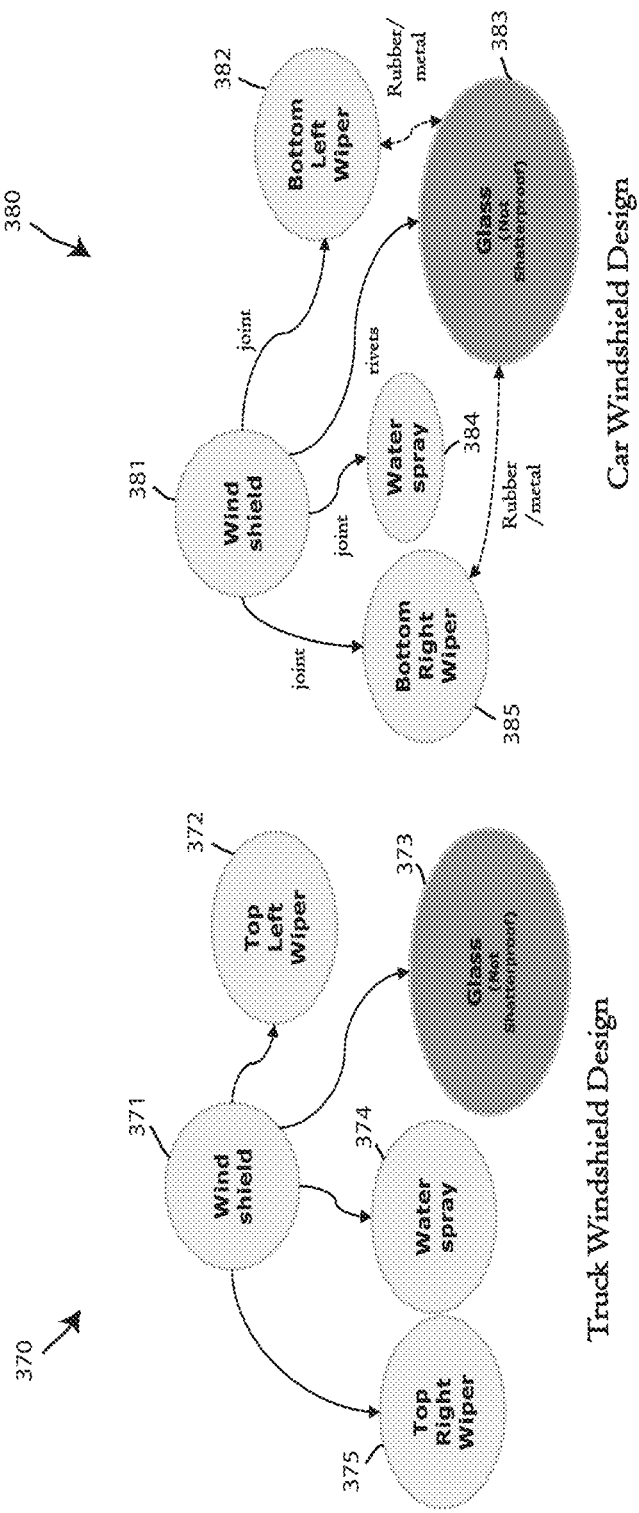
FIG. 6 depicts a pair of matched design graphs identified by the system of FIG. 1 using the method of FIG. 2, in accordance with embodiments of the present invention.

FIG. 5 depicts the first design graph 360a created by the system of FIG. 1 using the method of FIG. 2, in accordance with embodiments of the present invention. The first design graph 360a includes a door frame part 361 that is a high level part connected to various lower level parts. The door frame part 361 is connected to a door handle part 362a, a window glass part 363a, a window button part 364a, and a door lock part 365a. The door handle part 362a, the window glass part 363a, and the window button part 364a may be second level parts just below the door frame part 361 on the design graph hierarchy. The door lock part 365a is shown as a sub assembly part that is related or otherwise connected to the door handle part 362. It should be understood that the design graph 360a is shown as an exemplary design graph, and that any design graphs having varying degrees of complexity and levels of dependency are contemplated FIG. 6 depicts a pair of matched design graphs 370, 380 identified by the system of FIG. 1 using the method of FIG. 2, in accordance with embodiments of the present invention. The first matched design graph 370 includes a first wind shield part 371, a first top left wiper part 372, a first glass part 373, a first water spray part 374 and a first top tight wiper part 375. In the embodiment shown, the first matched design graph 370 may correspond to a truck windshield design, for example. The second matched design graph 380 includes a second wind shield part 381, a second top left wiper part 382, a second glass part 383, a second water spray part 384 and a second top right wiper part 385. In the embodiment shown, the second matched design graph 380 may correspond to a car windshield design, for example. The car windshield design shows the various joints, rivets, and/or materials (rubber/metal) that may connect each of the various parts 381, 382, 383, 384, 385.

Figure 7:
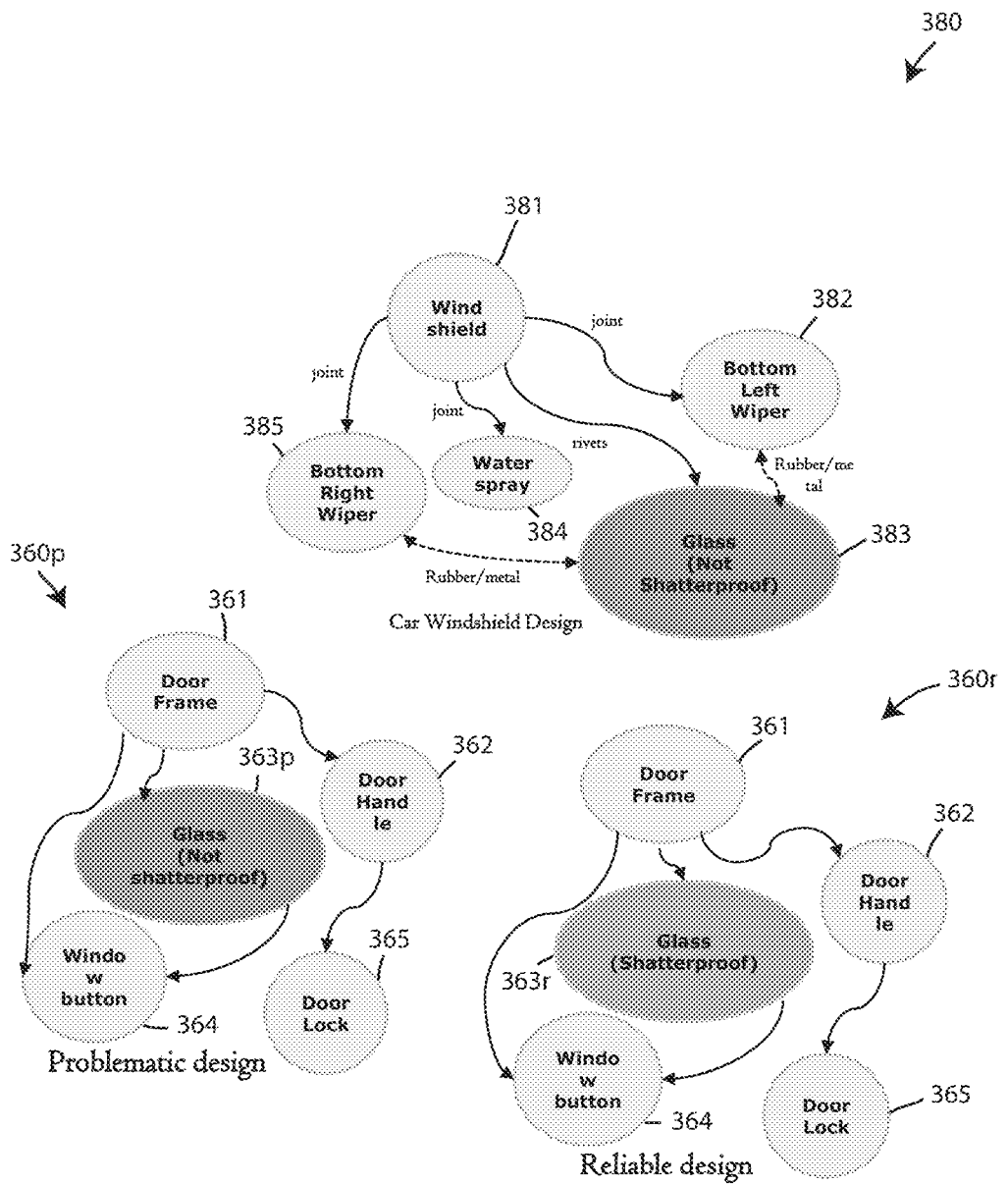
FIG. 7 depicts a potentially anomalous design graph, an identified similar design graph, and a suggested reliable design graph, identifying by the system of FIG. 1 using the method of FIG. 2, in accordance with embodiments of the present invention.

FIG. 7 depicts a potentially anomalous design graph 360p, an identified similar design graph 381, and a suggested reliable design graph 360r, identifying by the system of FIG. 1 using the method of FIG. 2, in accordance with embodiments of the present invention. The potentially anomalous design graph 360p includes a door frame part 361, a door handle part 362, a glass part 363p that is marked as not shatterproof, a window button part 364, and a door lock part 365. The potentially anomalous design graph 360p may be found anomalous based on various information provided to the computer system 120 as described herein above. The identified similar design graph 381 includes a wind shield part 381, a bottom left wiper part 382, a glass part 383 that is marked as not shatterproof, a water spray part 384, and a bottom right wiper part 385. The identified similar design graph 381 may be a design graph of a different but similar design, as found, for example, by the anomaly module 134. The suggested reliable design graph 360r includes a door frame part 361, a door handle part 362, a glass part 363 that is marked as shatterproof, a window button part 364, and a door lock part 365. The suggested reliable design graph 360r may be a design graph related to a reliable design as found, for example, by the design change module 135.

Figure 8:
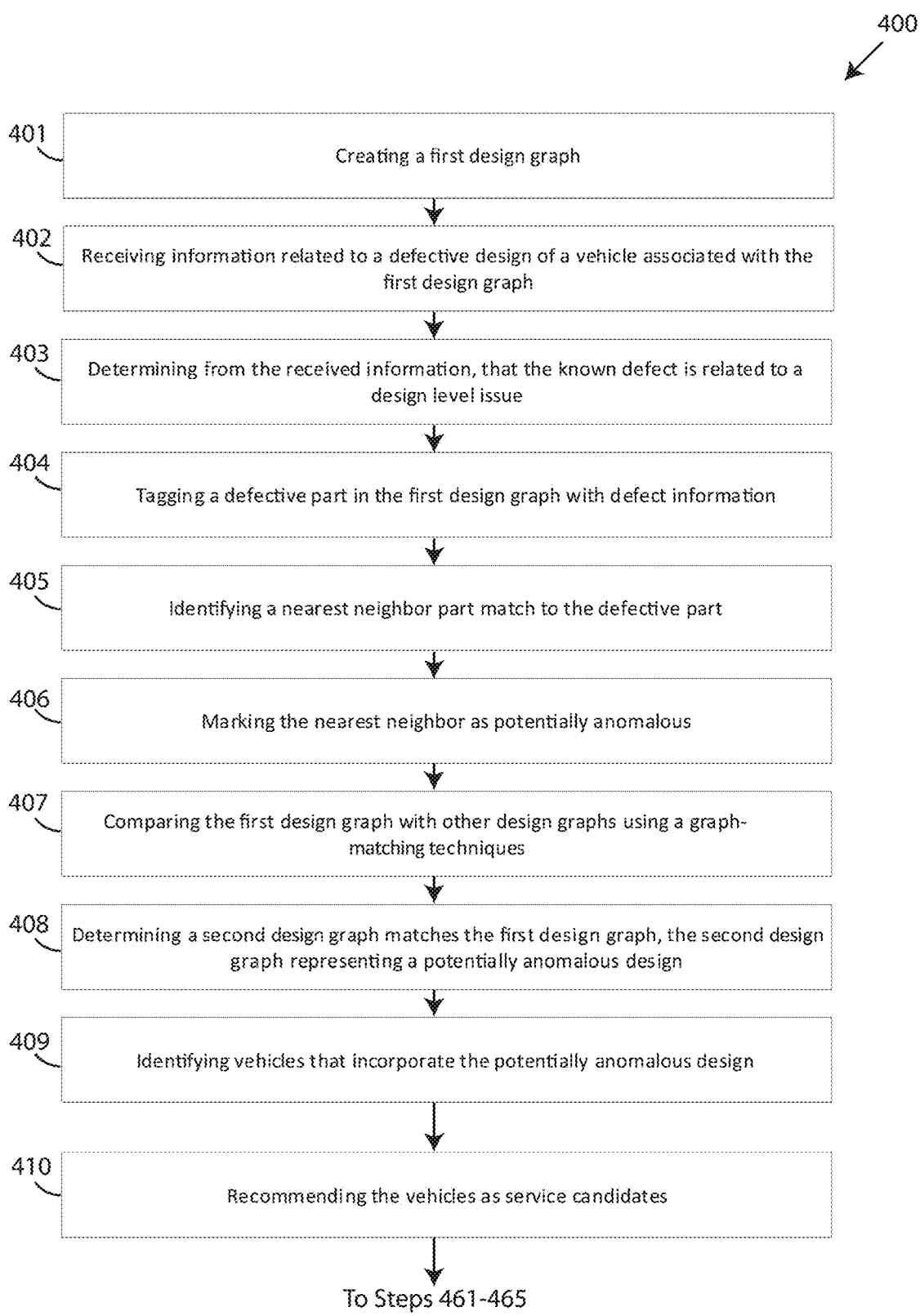
FIG. 8 depicts a flow chart of a method for detecting vehicle defects, in accordance with embodiments of the present invention.

FIG. 8 depicts a flow chart of a method 400 for detecting vehicle defects, in accordance with embodiments of the present invention. The method includes a step 401 of creating a first design graph. The method 400 includes a step 402 of receiving information related to a defective design of a vehicle associated with the first design graph. The method 400 includes a step 403 of determining from the received information, that the known defect is related to a design level issue. The method 400 includes a step 404 of tagging a defective part in the first design graph with defect information. The method 400 includes a step 405 of identifying a nearest neighbor part match to the defective part. The method 400 includes a step 406 of marking the nearest neighbor as potentially anomalous. The method 400 includes a step 407 of comparing the first design graph with other design graphs using a graph-matching technique. The method 400 includes a step 408 of determining a second design graph matches the first design graph, the second design graph representing a potentially anomalous design. The method 400 includes a step 409 of identifying vehicles that incorporate the potentially anomalous design. The method includes a step 410 of recommending the vehicles as service candidates.

Figure 9:
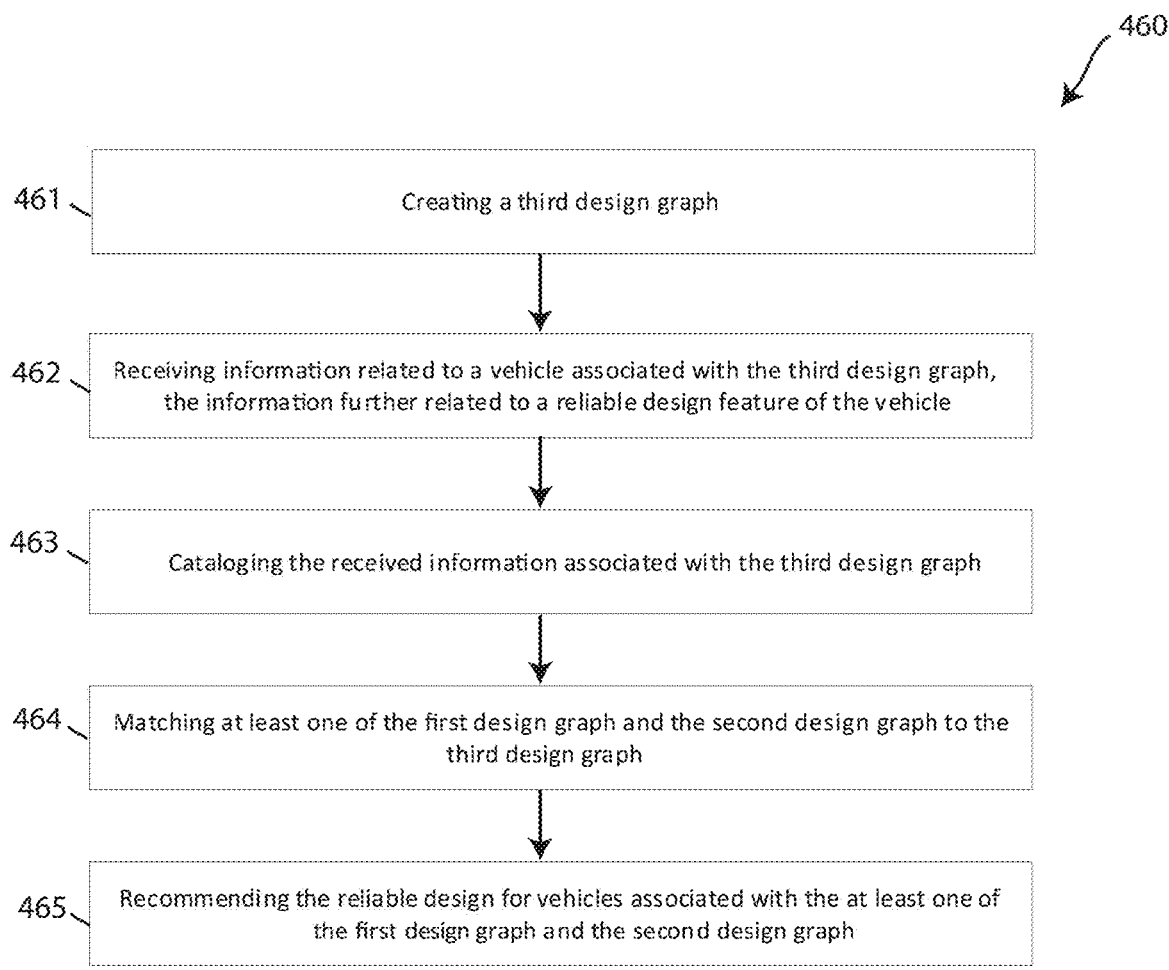
FIG. 9 depicts additional steps of the method of FIG. 8, in accordance with embodiments of the present invention.
Figure 10:
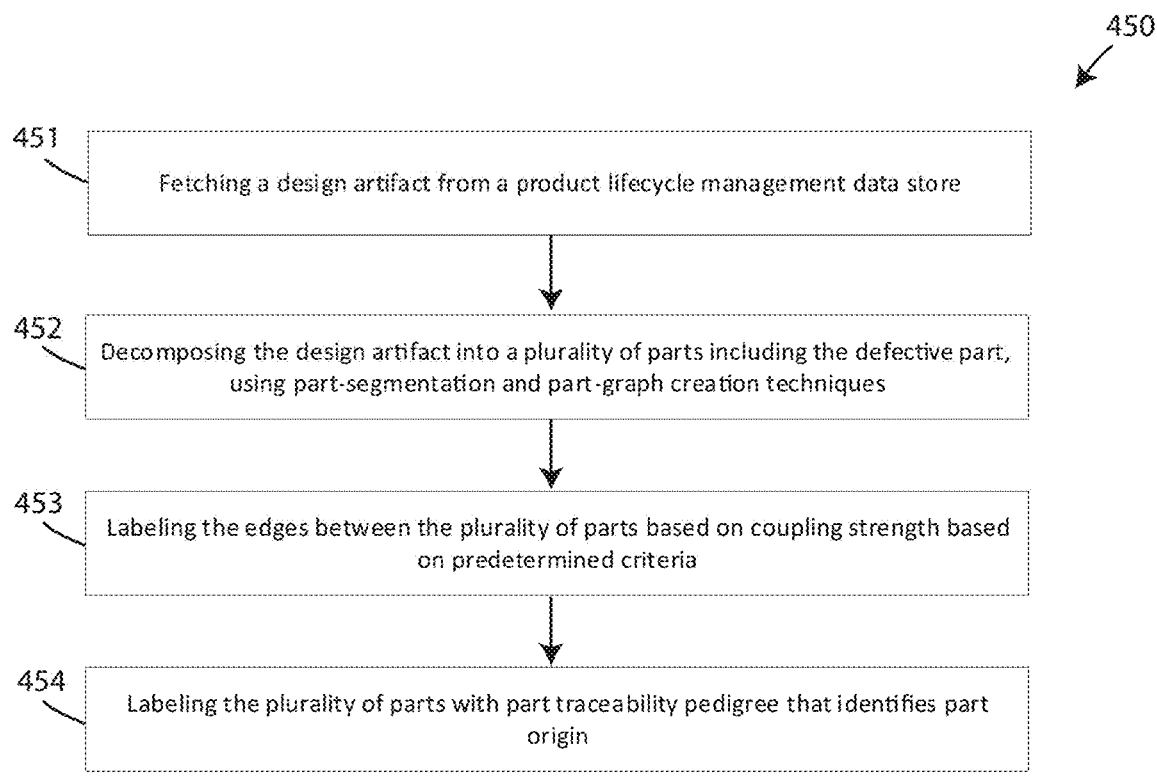
FIG. 10 depicts a method of creating a design graph, in accordance with embodiments of the present invention.

FIG. 9 depicts a method 460 of matching design graphs from the first and second graphs created in the method 400, in accordance with embodiments of the present invention. The method 460 may include steps that are additions to the steps 401-410 described hereinabove with respect to the method 400. The steps 461-464 of the method 460 may be found anywhere within the method 400 and not necessarily in the order provided, or at the end of the method 400. The method 460 includes a step 461 of creating a third design graph. The method 460 includes a step 462 of receiving information related to a vehicle associated with the third design graph, the information further related to a reliable design feature of the vehicle. The method 460 includes a step 463 of cataloging the received information associated with the third design graph. The method 460 includes a step 464 of matching at least one of the first design graph and the second design graph created in the method 400 to the third design graph. The method 460 includes recommending the reliable design for vehicles associated with the at least one of the first design graph and the second design graph FIG. 10 depicts a method 450 of creating a design graph, in accordance with embodiments of the present invention. The method 450 includes a first step 451 of fetching a design artifact from a product lifecycle management data store. The method 450 includes a step 452 of decomposing the design artifact into a plurality of parts including the defective part, using part-segmentation and part-graph creation techniques. The method 450 includes a step 453 of labeling the edges between the plurality of parts based on coupling strength based on predetermined criteria. The method includes a step 454 of labeling the plurality of parts with part traceability pedigree that identifies part origin.

Figure 11:
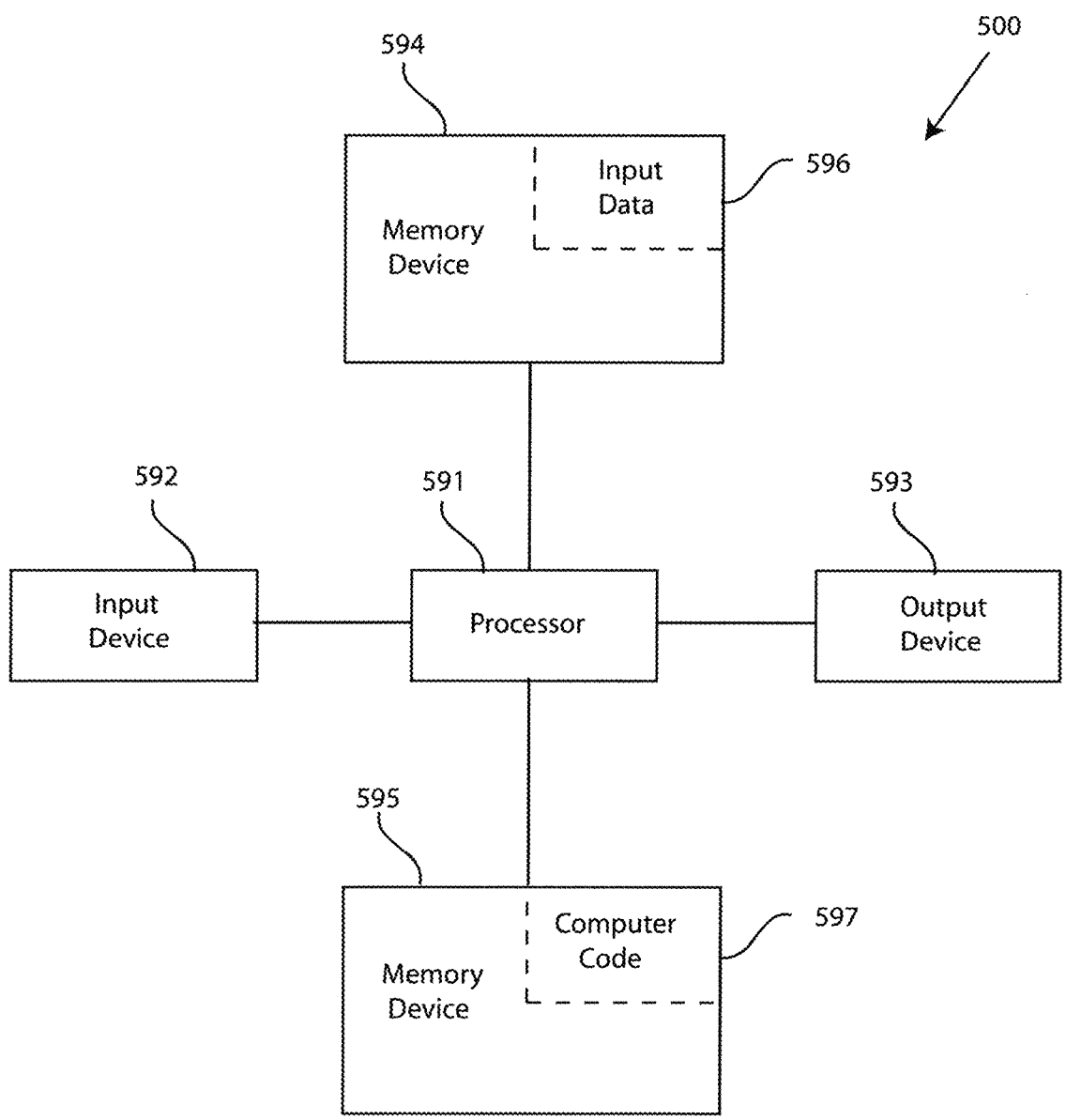
FIG. 11 depicts a block diagram of a computer system for the system for detecting vehicle defects of FIG. 1, capable of implementing methods for detecting vehicle defects as shown in FIGS. 2-10, in accordance with embodiments of the present invention.
Figure 12:
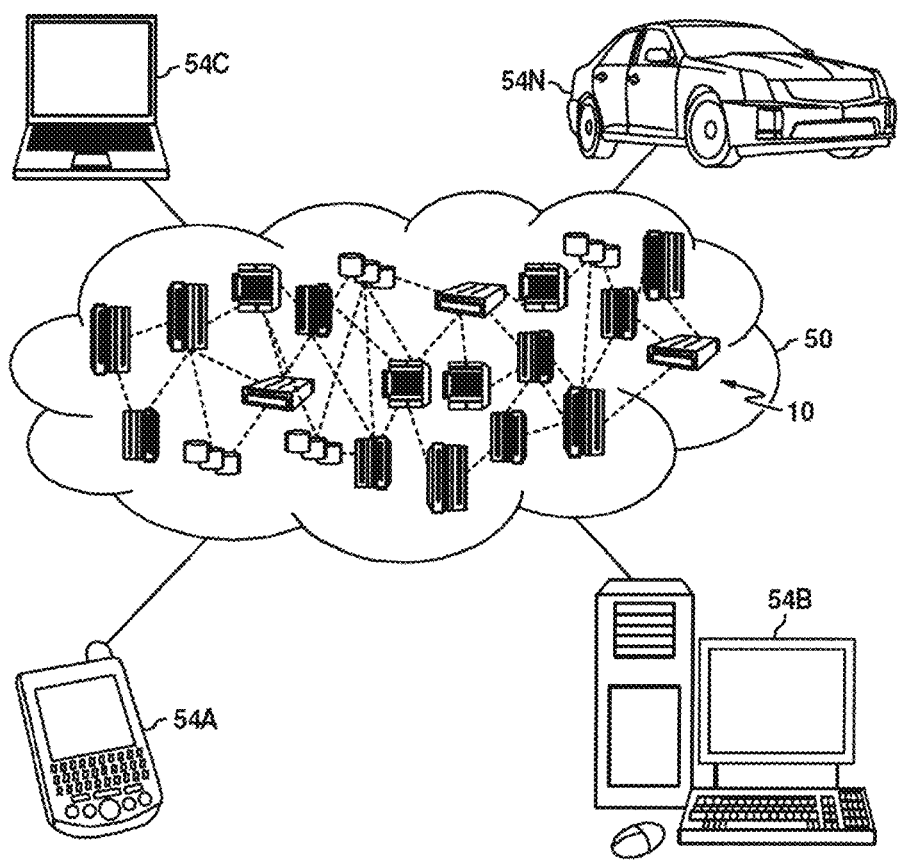
FIG. 12 depicts a cloud computing environment, in accordance with embodiments of the present invention.
Figure 13:
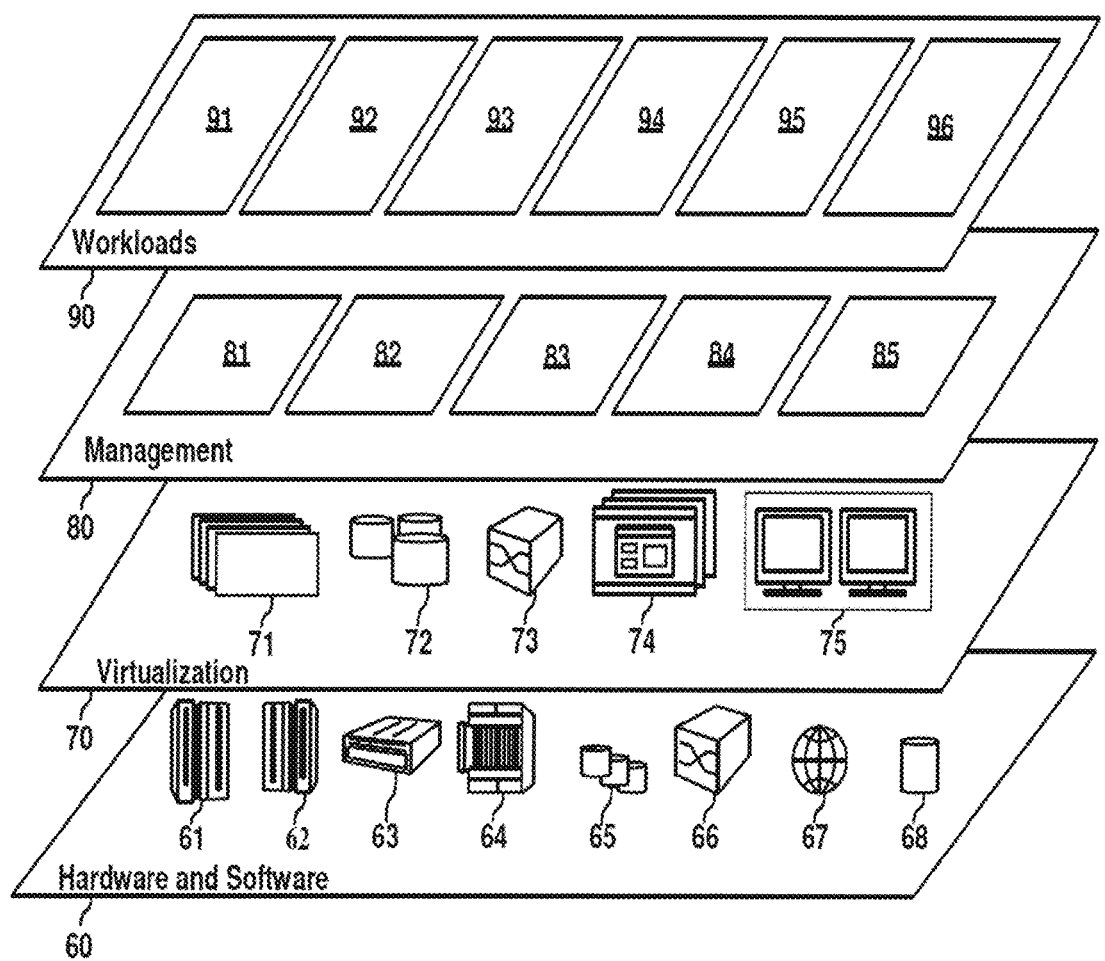
FIG. 13 depicts abstraction model layers, in accordance with embodiments of the present invention.

FIG. 11 illustrates a block diagram of a computer system that may representative of any computer or computer system within the system for detecting vehicle defects of FIG. 1, capable of implementing methods for detecting vehicle defects of FIGS. 2-10, in accordance with embodiments of the present invention. The computer system 500 may generally comprise a processor 591, an input device 592 coupled to the processor 591, an output device 593 coupled to the processor 591, and memory devices 594 and 595 each coupled to the processor 591. The input device 592, output device 593 and memory devices 594, 595 may each be coupled to the processor 591 via a bus. Processor 591 may perform computations and control the functions of computer 500, including executing instructions included in the computer code 597 for the tools and programs capable of implementing a method for detecting vehicle defects, in the manner prescribed by the embodiments of FIGS. 2-10 using the system for detecting vehicle defects of FIG. 1, wherein the instructions of the computer code 597 may be executed by processor 591 via memory device 595. The computer code 597 may include software or program instructions that may implement one or more algorithms for implementing the methods for detecting vehicle defects, as described in detail above. The processor 591 executes the computer code 597. Processor 591 may include a single processing unit, or may he distributed across one or more processing units in one or more locations (e.g., on a client and server).

The memory device 594 may include input data 596. The input data 596 includes any inputs required by the computer code 597. The output device 593 displays output from the computer code 597. Either or both memory devices 594 and 595 may be used as a computer usable storage medium (or program storage device) having a computer readable program embodied therein and/or having other data stored therein, wherein the computer readable program comprises the computer code 597. Generally, a computer program product (or, alternatively, an article of manufacture) of the computer system 500 may comprise said computer usable storage medium (or said program storage device).

Memory devices 594, 595 include any known computer readable storage medium, including those described in detail below. In one embodiment, cache memory elements of memory devices 594, 595 may provide temporary storage of at least some program code computer code 597) in order to reduce the number of times code must be retrieved from bulk storage while instructions of the computer code 597 are executed. Moreover, similar to processor 591, memory devices 594, 595 may reside at a single physical location, including one or more types of data storage, or be distributed across a plurality of physical systems in various forms. Further, memory devices 594, 595 can include data distributed across, for example, a local area network (LAN) or a wide area network (WAN). Further, memory devices 594, 595 may include an operating system (not shown) and may include other systems not shown in FIG. 5.

in some embodiments, the computer system 500 may further be coupled to an Input/output (I/O) interface and a computer data storage unit. An I/O interface may include any system for exchanging information to or from an input device 592 or output device 593. The input device 592 may be, inter alia, a keyboard, a mouse, etc. The output device 593 may be, inter alia, a printer, a plotter, a display device (such as a computer screen), a magnetic tape, a removable hard disk, a floppy disk, etc. The memory devices 594 and 595 may be, inter alia, a hard disk, a floppy disk, a magnetic tape, an optical storage such as a compact disc (CD) or a digital video disc (DVD), a dynamic random access memory (DRAM), a read-only memory (ROM), etc. The bus may provide a communication link between each of the components in computer 500, and may include any type of transmission link, including electrical, optical, wireless, etc.

An I/O interface may allow computer system 500 to store information (e.g., data or program instructions such as program code 597) on and retrieve the information from computer data storage unit (not shown). Computer data storage unit includes a known computer-readable storage medium, which is described below. In one embodiment, computer data storage unit may be a non-volatile data storage device, such as a magnetic disk drive (i.e., hard disk drive) or an optical disc drive (e.g., a CD-ROM drive which receives a CD-ROM disk). In other embodiments, the data storage unit may include a knowledge base or data repository 125 as shown in FIG. 1.

As will be appreciated by one skilled in the art, in a first embodiment, the present invention may be a method; in a second embodiment, the present invention may he a system; and in a third embodiment, the present invention may be a computer program product. Any of the components of the embodiments of the present invention can be deployed, managed, serviced, etc. by a service provider that offers to deploy or integrate computing infrastructure with respect to systems and methods for detecting vehicle defects. Thus, an embodiment of the present invention discloses a process for supporting computer infrastructure, where the process includes providing at least one support service for at least one of integrating, hosting, maintaining and deploying computer-readable code (e.g., program code 597) in a computer system (e.g., computer 500) including one or more processor (s) 591, wherein the processor(s) carry out instructions contained in the computer code 597 causing the computer system to provide a system for detecting vehicle defects. Another embodiment discloses a process for supporting computer infrastructure, where the process includes integrating computer-readable program code into a computer system including a processor.

The step of integrating includes storing the program code in a computer-readable storage device of the computer system through use of the processor. The program code, upon being executed by the processor, implements a method for detecting vehicle defects. Thus, the present invention discloses a process for supporting, deploying and/or integrating computer infrastructure, integrating, hosting, maintaining, and deploying computer-readable code into the computer system 500, wherein the code in combination with the computer system 500 is capable of performing a method for detecting vehicle defects.

A computer program product of the present invention comprises one or more computer readable hardware storage devices having computer readable program code stored therein, said program code containing instructions executable by one or more processors of a computer system to implement the methods of the present invention.

A computer system of the present invention comprises one or more processors, one or more memories, and one or more computer readable hardware storage devices, said one or more hardware storage devices containing program code executable by the one or more processors via the one or more memories to implement the methods of the present invention.

The present invention may be a system, a method, and/or a computer program product at any possible technical detail level of integration. The computer program product may include a computer readable storage medium (or media) having computer readable program instructions thereon for causing a processor o carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection maybe made to an external computer (for example, through the Internet using an Internet Service Provider). In sonic embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

It is to be understood that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g., networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported, providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure that includes a network of interconnected nodes.

Referring now to FIG. 6, illustrative cloud computing environment 50 is depicted. As shown, cloud computing environment 50 includes one or more cloud computing nodes 10 with which local computing devices used by cloud consumers, such as, for example, personal digital assistant (PDA) or cellular telephone 54A, desktop computer 54B, laptop computer 54C, and/or automobile computer system 54N may communicate. Nodes 10 may communicate with one another. They may be grouped (not shown) physically or virtually, in one or more networks, such as Private, Community, Public, or Hybrid clouds as described hereinabove, or a combination thereof. This allows cloud computing environment 50 to offer infrastructure, platforms and/or software as services for which a cloud consumer does not need to maintain resources on a local computing device. It is understood that the types of computing devices 54A, 54B, 54C and 54N shown in FIG. 6 are intended to be illustrative only and that computing nodes 10 and cloud computing environment 50 can communicate with any type of computerized device over any type of network and/or network addressable connection (e.g., using a web browser)

Referring now to FIG. 7, a set of functional abstraction layers provided by cloud computing environment 50 (see FIG. 6) is shown. It should be understood in advance that the components, layers, and functions shown in FIG. 7 are intended to be illustrative only and embodiments of the invention are not limited thereto. As depicted, the following layers and corresponding functions are provided:

Hardware and software layer 60 includes hardware and software components. Examples of hardware components include: mainframes 61; RISC (Reduced Instruction Set Computer) architecture based servers 62; servers 63; blade servers 64; storage devices 65; and networks and networking components 66. In some embodiments, software components include network application server software 67 and database software 68.

Virtualization layer 70 provides an abstraction layer from hick the following examples of virtual entities may be provided: virtual servers 71; virtual storage 72; virtual networks 73, including virtual private networks; virtual applications and operating systems 74; and virtual clients 75.

In one example, management layer 80 may provide the functions described below. Resource provisioning 81 provides dynamic procurement of computing resources and other resources that are utilized to perform tasks within the cloud computing environment. Metering and Pricing 82 provide cost tracking as resources are utilized within the cloud computing environment, and billing or invoicing for consumption of these resources. In one example, these resources may include application software licenses. Security provides identity verification for cloud consumers and tasks, as well as protection for data and other resources. User portal 83 provides access to the cloud computing environment for consumers and system administrators. Service level management 84 provides cloud computing resource allocation and management such that required service levels are met. Service Level Agreement (SLA) planning and fulfillment 85 provide pre-arrangement for, and procurement of, cloud computing resources for which a future requirement is anticipated in accordance with an SLA.

Workloads layer 90 provides examples of functionality for which the cloud computing environment may be utilized. Examples of workloads and functions which may be provided from this layer include: mapping and navigation 91; software development and lifecycle management 92; virtual classroom education delivery 93; data analytics processing 94; transaction processing 95; and processing related to detecting vehicle defects 96.

While embodiments of the present invention have been described herein for purposes of illustration, many modifications and changes will become apparent to those skilled in the art. Accordingly, the appended claims are intended to encompass all such modifications and changes as fall within the true spirit and scope of this invention.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of detecting vehicle defects, the method comprising:
    receiving, by one or more processors of a computer system, information related to a plurality of vehicles from a product lifecycle management (PLM) data store, wherein the plurality of vehicles have the same model and have a plurality of geographic or performance conditions;
    receiving, by the one or more processors of the computer system, diagnostic, service history, and/or warranty data related to the plurality of vehicles;
    creating, by the one or more processors of the computer system, a first design graph using the information from the PLM data store and the diagnostic, service history, and/or warranty data, the first design graph associated with a first vehicle of the plurality of vehicles;
    creating, by the one or more processors of the computer system, at least one other design graph for each of the plurality of vehicles using the information from the PLM data store and the diagnostic, service history, and/or warranty data related to the plurality of vehicles;
    receiving, by the one or more processors of the computer system, information related to a defective design of the first vehicle associated with the first design graph;
    tagging, by the one or more processors of the computer system, a defective part in the first design graph with defect information;
    comparing, by the one or more processors of the computer system, the first design graph with each of the plurality of other design graphs for each of the plurality of vehicles using a graph-matching technique;
    determining, by the one or more processors of the computer system, which of the plurality of other design graphs match the first design graph, wherein matches represent a nearest neighbor match to the defective design;
    identifying, by the one or more processors of the computer system, a plurality of recall candidate vehicles from the plurality of vehicles that incorporate a design associated with the nearest neighbor match to the defective design; and
    initiating, by the one or more processors of the computer system, a recall of the plurality of recall candidate vehicles.

2. The method of claim 1, wherein the creating the first design graph further includes:
    fetching, by the one or more processors of the computer system, a design artifact from a product lifecycle management data store; and
    decomposing, by the one or more processors of the computer system, the design artifact into a plurality of parts including the defective part, using part-segmentation and part-graph creation techniques.

3. The method of claim 2, wherein the creating the first design graph further includes:
    labeling, by the one or more processors of the computer system, the edges between the plurality of parts based on coupling strength based on predetermined criteria; and
    labeling, by the one or more processors of the computer system, the plurality of parts with part traceability pedigree that identifies part origin.

4. The method of claim 1, further comprising:
    matching, by the one or more processors of the computer system, at least one of the first design graph and a second design graph that matches the first design graph to a third design graph, the third design graph representing a reliable design; and
    recommending, by the one or more processors of the computer system, the reliable design for vehicles associated with the at least one of the first design graph and the second design graph.

5. The method of claim 4, further comprising:
    creating, by the one or more processors of the computer system, the third design graph;
    receiving, by the one or more processors of the computer system, information related to a vehicle associated with the third design graph, the information further related to a reliable design feature of the vehicle;

cataloging, by the one or more processors of the computer system, the received information associated with the third design graph.

6. The method of claim 1, further comprising:
identifying, by the one or more processors of the computer system, a nearest neighbor part match to the defective part;
marking, by the one or more processors of the computer system, the nearest neighbor as potentially anomalous.

7. The method of claim 1, further comprising:
determining, by the one or more processors of the computer system from the received information, that the known defect is related to a design level issue.

8. A computer system, comprising:
one or more processors;
one or more memory devices coupled to the one or more processors; and
one or more computer readable storage devices coupled to the one or more processors, wherein the one or more storage devices contain program code executable by the one or more processors via the one or more memory devices to implement a method of detecting vehicle defects, the method comprising:
receiving, by the one or more processors of the computer system, information related to a plurality of vehicles from a product lifecycle management (PLM) data store, wherein the plurality of vehicles have the same model and have a plurality of geographic or performance conditions;
receiving, by the one or more processors of the computer system, diagnostic, service history, and/or warranty data related to the plurality of vehicles;
creating, by the one or more processors of the computer system, a first design graph using the information from the PLM data store and the diagnostic, service history, and/or warranty data, the first design graph associated with a first vehicle of the plurality of vehicles;
creating, by the one or more processors of the computer system, at least one other design graph for each of the plurality of vehicles using the information from the PLM data store and the diagnostic, service history, and/or warranty data related to the plurality of vehicles;
receiving, by the one or more processors of the computer system, information related to a defective design of the first vehicle associated with the first design graph;
tagging, by the one or more processors of the computer system, a defective part in the first design graph with defect information;
comparing, by the one or more processors of the computer system, the first design graph with each of the plurality of other design graphs for each of the plurality of vehicles using a graph-matching technique;
determining, by the one or more processors of the computer system, which of the plurality of other design graphs match the first design graph, wherein matches represent a nearest neighbor match to the defective design;
identifying, by the one or more processors of the computer system, a plurality of recall candidate vehicles from the plurality of vehicles that incorporate a design associated with the nearest neighbor match to the defective design; and
initiating, by the one or more processors of the computer system, a recall of the plurality of recall candidate vehicles.

9. The computer system of claim 8, wherein the creating the first design graph further includes:
fetching, by the one or more processors of the computer system, a design artifact from a product lifecycle management data store; and
decomposing, by the one or more processors of the computer system, the design artifact into a plurality of parts including the defective part, using part-segmentation and part-graph creation techniques.

10. The computer system of claim 9, wherein the creating the first design graph further includes:
labeling, by the one or more processors of the computer system, the edges between the plurality of parts based on coupling strength based on predetermined criteria; and
labeling, by the one or more processors of the computer system, the plurality of parts with part traceability pedigree that identifies part origin.

11. The computer system of claim 8, the method further comprising:
matching, by the one or more processors of the computer system, at least one of the first design graph and a second design graph that matches the first design graph to a third design graph, the third design graph representing a reliable design; and
recommending, by the one or more processors of the computer system, the reliable design for vehicles associated with the at least one of the first design graph and the second design graph.

12. The computer system of claim 11, the method further comprising:
creating, by the one or more processors of the computer system, the third design graph;
receiving, by the one or more processors of the computer system, information related to a vehicle associated with the third design graph, the information further related to a reliable design feature of the vehicle;
cataloging, by the one or more processors of the computer system, the received information associated with the third design graph.

13. The computer system of claim 8, the method further comprising:
identifying, by the one or more processors of the computer system, a nearest neighbor part match to the defective part; and
marking, by the one or more processors of the computer system, the nearest neighbor as potentially anomalous.

14. The computer system of claim 8, the method further comprising:
determining, by the one or more processors of the computer system from the received information, that the known defect is related to a design level issue.

15. A computer program product, comprising a computer readable hardware storage device storing a computer readable program code, the computer readable program code comprising an algorithm that when executed by one or more processors of a computer system implements a method of detecting vehicle defects, the method comprising:
receiving, by the one or more processors of the computer system, information related to a plurality of vehicles from a product lifecycle management (PLM) data store, wherein the plurality of vehicles have the same model and have a plurality of geographic or performance conditions;

receiving, by the one or more processors of the computer system, diagnostic, service history, and/or warranty data related to the plurality of vehicles;

creating, by the one or more processors of the computer system, a first design graph using the information from the PLM data store and the diagnostic, service history, and/or warranty data, the first design graph associated with a first vehicle of the plurality of vehicles;

creating, by the one or more processors of the computer system, at least one other design graph for each of the plurality of vehicles using the information from the PLM data store and the diagnostic, service history, and/or warranty data related to the plurality of vehicles;

receiving, by the one or more processors of the computer system, information related to a defective design of the first vehicle associated with the first design graph;

tagging, by the one or more processors of the computer system, a defective part in the first design graph with defect information;

comparing, by the one or more processors of the computer system, the first design graph with each of the plurality of other design graphs for each of the plurality of vehicles using a graph-matching technique;

determining, by the one or more processors of the computer system, which of the plurality of other design graphs match the first design graph, wherein matches represent a nearest neighbor match to the defective design;

identifying, by the one or more processors of the computer system, a plurality of recall candidate vehicles from the plurality of vehicles that incorporate a design associated with the nearest neighbor match to the defective design; and initiating, by the one or more processors of the computer system, a recall of the plurality of recall candidate vehicles.

16. The computer program product of claim 15, wherein the creating the first design graph further includes:

fetching, by the one or more processors of the computer system, a design artifact from a product lifecycle management data store; and decomposing, by the one or more processors of the computer system, the design artifact into a plurality of parts including the defective part, using part-segmentation and part-graph creation techniques.

17. The computer program product of claim 16, wherein the creating the first design graph further includes:

labeling, by the one or more processors of the computer system, the edges between the plurality of parts based on coupling strength based on predetermined criteria; and labeling, by the one or more processors of the computer system, the plurality of parts with part traceability pedigree that identifies part origin.

18. The computer program product of claim 15, the method further comprising:

matching, by the one or more processors of the computer system, at least one of the first design graph and a second design graph that matches the first design graph to a third design graph, the third design graph representing a reliable design; and recommending, by the one or more processors of the computer system, the reliable design for vehicles associated with the at least one of the first design graph and the second design graph.

19. The computer program product of claim 18, the method further comprising:

creating, by the one or more processors of the computer system, the third design graph;

receiving, by the one or more processors of the computer system, information related to a vehicle associated with the third design graph, the information further related to a reliable design feature of the vehicle;

cataloging, by the one or more processors of the computer system, the received information associated with the third design graph.

20. The computer program product of claim 15, the method further comprising:

identifying, by the one or more processors of the computer system, a nearest neighbor part match to the defective part; and marking, by the one or more processors of the computer system, the nearest neighbor as potentially anomalous.

\* \* \* \* \*